United States Patent [19]
Huo

[11] Patent Number: 5,901,751
[45] Date of Patent: May 11, 1999

[54] RESTRICTOR SHIELD HAVING A VARIABLE EFFECTIVE THROUGHOUT AREA

[75] Inventor: David Datong Huo, Palo Alto, Calif.

[73] Assignee: Applied Materials, Inc., Santa Clara, Calif.

[21] Appl. No.: 08/612,651

[22] Filed: Mar. 8, 1996

[51] Int. Cl.[6] .................................................. F15D 1/02
[52] U.S. Cl. ............................................... 138/45; 138/46
[58] Field of Search ............................. 138/45, 46, 43

[56] References Cited

U.S. PATENT DOCUMENTS

| | | | |
|---|---|---|---|
| 3,860,036 | 1/1975 | Newman, Jr. | 138/45 |
| 3,895,646 | 7/1975 | Howat | 138/45 |
| 4,098,296 | 7/1978 | Grasso et al. | 138/45 |
| 4,230,149 | 10/1980 | Worthen et al. | 138/46 |
| 4,336,904 | 6/1982 | Jardinier et al. | 138/46 |
| 4,382,549 | 5/1983 | Christy et al. | 138/46 |
| 4,828,169 | 5/1989 | Smith | 138/46 |
| 4,909,695 | 3/1990 | Hurwitt et al. | 414/217 |
| 4,989,456 | 2/1991 | Stupecky | 138/46 |
| 5,082,517 | 1/1992 | Moslehi | 156/345 |
| 5,312,509 | 5/1994 | Eschbach | 156/345 |

*Primary Examiner*—Denise L. Ferensic
*Assistant Examiner*—James F. Hook
*Attorney, Agent, or Firm*—Thomason & Moser

[57] ABSTRACT

Apparatus, positioned at an inlet port to a pump, for shielding the pump from a process chamber of a semiconductor wafer processing system, where the apparatus has a variable effective throughput area. Specifically, the apparatus is a restrictor shield having a first effective throughput area during processing and a second effective throughput area during bakeout, where the first effective throughput area is typically less than the second effective throughput area. The selection of the effective throughput area is directly responsive to the temperature within the process chamber.

20 Claims, 4 Drawing Sheets

5,901,751

RESTRICTOR SHIELD HAVING A VARIABLE EFFECTIVE THROUGHOUT AREA

BACKGROUND OF THE DISCLOSURE

1. Field of the Invention

The present invention relates to semiconductor processing equipment and, more particularly, to a restrictor shield, located between a process chamber and a pump, having a variable effective throughput area.

2. Description of the Background Art

To produce a sufficient vacuum for processing semiconductor wafers in a process chamber of a semiconductor wafer processing system, a cryogenic pump (commonly referred to as a cryo-pump) is used to attain the vacuum. Systems that utilize cryo-pumps include physical vapor deposition (PVD) systems that require an ultra high vacuum (UHV), approximately $10^{-9}$ Torr, to achieve optimal process conditions and process performance.

Typically, the cryo-pump is connected to the process chamber via a conduit, where the connection point of the conduit to the process chamber is known as the "cryo-port". The area of the cryo-port opening is critical to achieving particular process results during a deposition process. Although the cryo-port has a fixed area, it is typically fitted with a cryo-pump restrictor shield (referred to herein as a cryo-shield) that defines the effective throughput area of the cryo-port. A typical cryo-shield is an aluminum plate having approximately a six inch (15.25 cm) diameter. The plate contains a plurality of apertures of predefined diameter. The cumulative area of the apertures defines the effective throughput area of the cryo-port. As such, different plates having differing effective areas are installed over the cryo-port depending upon the particular process results desired. One example of a PVD system that uses such a cryo-shield is the Endura model manufactured by Applied Materials, Inc. of Santa Clara, Calif.

Typically, before a process chamber is used to process semiconductor wafers, the chamber goes through a process known as "bakeout", where the chamber is heated by lamps to desorb and evaporate any volatile particles within the chamber. The volatile particles are removed by the chamber by pumping, e.g., usually by using a combination of pump types including turbo-pumps, cryo-pumps, and the like. Once the volatile particles have been pumped from the chamber, the chamber is allowed to cool to a nominal temperature over a period of time known as the cooldown period. A chamber is considered "qualified" for processing when the chamber achieves a sufficient vacuum (e.g., $8\times10^{-9}$ to $5\times10^{-9}$ Torr) after both bakeout and cooldown are complete. The bakeout and cooldown period can be as long as 80 hours. Thus, for a substantial amount of time, the processing equipment is being initialized and is not processing wafers.

The duration of the bakeout and cooldown period is directly proportional to the effective throughput area of the cryo-port. To facilitate a high gas flow rate during bakeout and reduce the bakeout period, it is desirable to have as large of a cryo-port effective throughput area as possible. However, the cryo-shield is in place during bakeout in anticipation of processing once the chamber is qualified. As such, the cryo-port effective throughput area is inherently limited to the aperture area of the cryo-shield.

Therefore, there is a need in the art for a restrictor shield having a variable effective throughput area such that the effective throughput area can be increased during bakeout and set to a predefined area during processing.

SUMMARY OF THE INVENTION

The disadvantages heretofore associated with the prior art are overcome by the present invention of apparatus, positioned at an inlet port to a pump, for shielding the pump from a process chamber of a semiconductor wafer processing system, where the apparatus has a variable effective throughput area. Specifically, the apparatus is a restrictor shield for a pump having a first effective throughput area during wafer processing and a second effective throughput area during bakeout, where the first effective throughput area is typically less than the second effective throughput area. The selection of the effective throughput area is directly responsive to the temperature within the process chamber.

In particular, a first embodiment of the restrictor shield contains a mounting ring, a shield portion and an actuator. The mounting ring is a circular stainless steel disk of approximately six inches (15.25 cm) in diameter having a central aperture of approximately 5.35 (13.59) inches in diameter. The mounting ring has an outer diameter to fit over, and be slightly larger than, the diameter of a pump attachment port (cryo-port) of a process chamber. Additionally, the mounting ring has a plurality of mounting holes that match the mounting holes within the chamber walls that are typically used to affix a conventional cryo-shield over the cryo-port. As such, the mounting ring of the invention is affixed to the chamber walls in the exact manner of attachment of a conventional cryo-shield. Consequently, by replacing existing cryo-shields, the invention can be retrofitted to existing process chambers.

The shield portion is a circular aluminum disk containing a plurality of apertures (e.g., six circular apertures). The disk is sized to fit within the aperture of the mounting ring, i.e., the disk is slightly smaller than the diameter of aperture within the mounting ring. The cumulative open area of the plurality of apertures defines the first effective throughput area of the restrictor shield. The particular size of the first effective throughput area is generally defined by the particular process to be performed by the wafer processing equipment.

The actuator is typically a bimetal strip that is attached at a first end to the shield portion and attached at a second end to the mounting portion. The bimetal strip is an elongated, typically rectangular, element containing two different materials bonded to one another. The materials are typically metals or metal alloys. Due to the differing rates of thermal expansion of each material comprising the bimetal strip, such a strip deforms (bends) as the strip is heated. The amount of bending is proportional to the temperature of the bimetal. By judiciously selecting the materials that comprise the strip, the strip can be designed to repeatedly bend the same amount for a given temperature profile within the process chamber. Thus, as the chamber is heated during bakeout, the strip bends and moves the shield portion away from the pump port. As such, an opening is formed between an edge of the shield portion and the inner edge of the mounting portion. This opening increases the effective throughput area of the restrictor shield, i.e., producing the second effective throughput area.

In a second embodiment of the invention, the mounting ring and the shield portion are a single shield element, e.g., a disk containing a plurality of apertures. The singular disk is sized to fit over, and be slightly larger than, the diameter of a cryo-port of a process chamber. The cumulative open area of the plurality of apertures defines the first effective throughput area of the restrictor shield.

In this second embodiment, the actuator is a bimetal strip that is attached at a first end to the shield portion and attached at a second end to a wall of the process chamber proximate the cryo-port. The bimetal strip is an elongated, typically rectangular, element containing two different materials bonded to one another. Thus, as the chamber is heated during bakeout, the strip bends and moves the shield portion away from the cryo-port. As such, an opening is formed between an edge of the shield portion and the cryo-port. This opening increases the effective throughput area of the restrictor shield, i.e., producing the second effective throughput area.

In a third embodiment of the invention, the shield portion of the first embodiment, is segmented into two portions: an upper portion and a lower portion. The lower portion is affixed to the mounting ring by the previously discussed bimetal strip, i.e., a first actuator. The upper portion is movably affixed to the lower portion via a second actuator. Typically, the first and second actuators are fabricated of the same material and have similar dimensions. As the bakeout period progresses and the temperature in the process chamber rises, the first actuator moves the lower portion of the shield relative to the mounting ring, and the second actuator moves the upper portion of the shield relative to the lower portion. Consequently, a larger opening (larger second throughput area) is created relative to the opening created by either of the other embodiments of the invention. To further increase the second throughput area, the interconnection between the upper and lower portions of the shield are scalloped in a tongue-in-groove like arrangement such that, during bakeout temperatures, the scallops open to form additional apertures.

In any of the foregoing embodiments of the invention, when the temperature of the process chamber decreases during cooldown, the actuator(s) return to their original shape and, once again, position the shield portion in line with the mounting ring. As such, the effective throughput area of the restrictor shield is returned to the first effective throughput area and the chamber is ready for processing wafers.

The utilization of a restrictor shield having a variable effective throughput area has achieved substantial reduction in the bakeout period. For example, empirical data has shown the typical bakeout period to require 60 to 80 hours. In contrast, the bakeout period for a system using the present invention is reduced to 30 to 35 hours.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present invention is, in general, a restrictor shield, located between a process chamber and a pump, having a variable effective throughput area. Specifically, the restrictor shield has a first effective throughput area during wafer processing and a second effective throughput area during bakeout, where the first effective throughput area is typically less than the second effective throughput area. An actuator facilitates the selection of the particular throughput area that is used at any particular time. The actuator is a thermally responsive actuator such that the effective throughput area is directly responsive to the temperature of the process chamber. As such, the second effective throughput area is generated when the process chamber is in the bakeout period such that the bakeout period is reduced. The first effective throughput area is used during wafer processing to establish a pre-defined effective throughput area for an outlet port of the process chamber. Consequently, the invention facilitates a reduction of the bakeout period without compromising the optimal effective throughput area of the outlet port to achieve particular process results.

Figure 1:
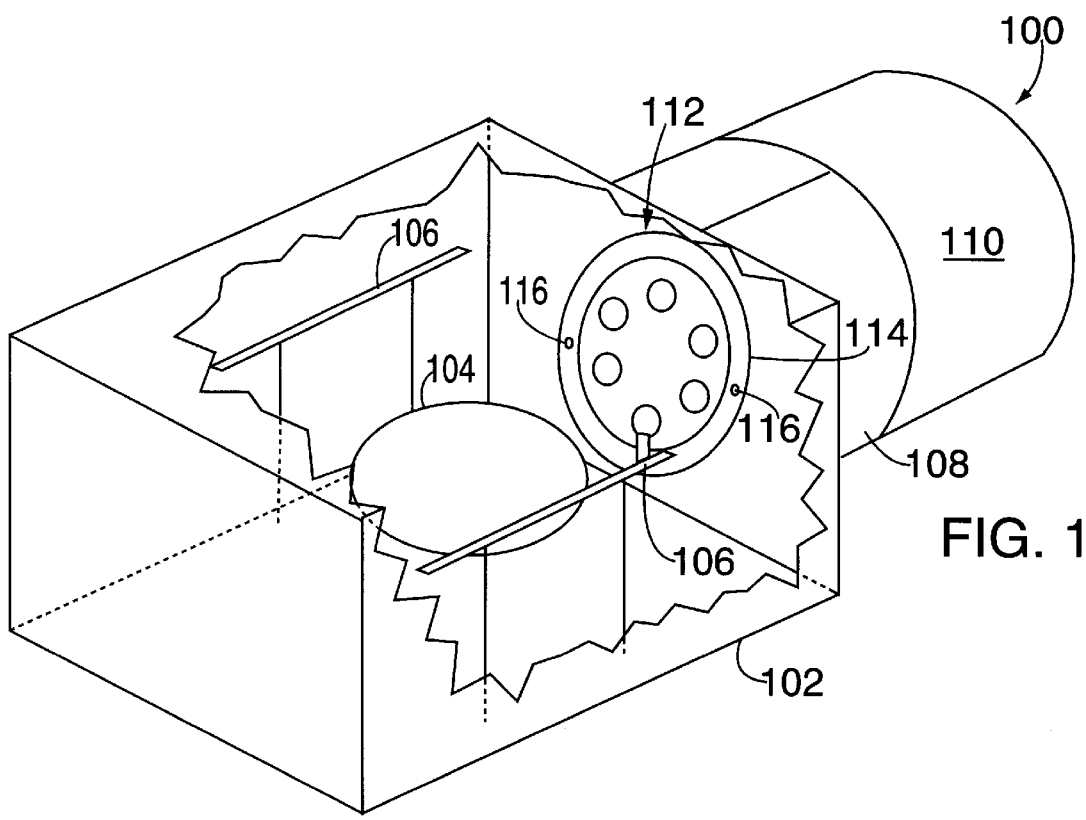
FIG. 1 is a schematic, perspective view of a process chamber incorporating the present invention.

FIG. 1 depicts a schematic view of a conventional process chamber 102 of a semiconductor processing system 100 that incorporates a first embodiment of the restrictor shield 112 of the present invention. In the depicted embodiment, the restrictor shield is located between the process chamber and a cryogenic pump. Although, in a broad sense, the restrictor shield of the present invention can be used as a variable flow regulator for any type of pump.

A typical wafer processing system that incorporates the invention includes a wafer chuck 104 for supporting the wafer within the system during processing, heater lamps 106 for heating the chamber during bakeout, a cryo-pump 110 (or other pump type), a vacuum conduit 108 connecting the cryo-pump to the chamber, and a cryo-port 114 located at the junction of the conduit 108 and the chamber 102. One example of such a system is the PVD system manufactured under model name Endura by Applied Materials, Inc. of Santa Clara, Calif.

The restrictor shield 112 of the present invention replaces the conventional cryo-shield such that the present invention can be retrofitted into a system that presently uses a conventional cryo-shield. As such, the restrictor shield fits over the cryo-port 114 and is affixed to a wall of the process chamber 102 proximate the cryo-port. Typically, the restrictor shield of the present invention is screwed to the chamber walls using mounting holes 116 that align with the mounting holes for a conventional cryo-shield.

Figure 2:
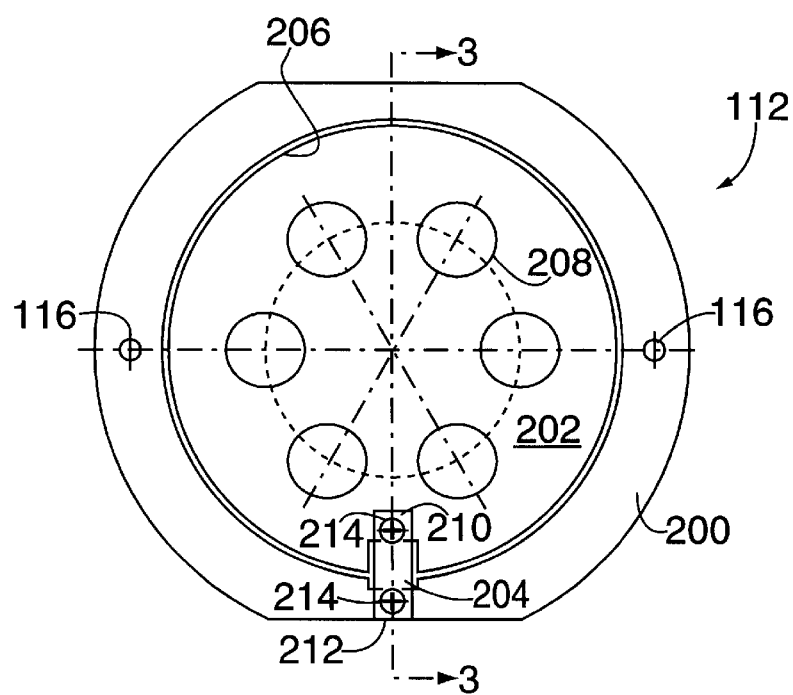
FIG. 2 depicts a front, plan view of a first embodiment of the restrictor shield of the present invention.

FIG. 2 depicts a front, plan view of the first embodiment of the restrictor shield 112 of the present invention. The restrictor shield contains a mounting ring 200, a shield portion 202 and a actuator 204. The mounting ring 200 is a circular stainless steel disk of approximately six inches (15.25 cm) in diameter having a central aperture 206 of approximately 5.35 (13.59 cm) inches in diameter. The mounting ring has an outer diameter to fit over, and be slightly larger than, the diameter of a pump attachment port (cryo-port) of the process chamber. Additionally, the mounting ring has a plurality of mounting holes 116 that match the mounting holes within the chamber walls that are typically used to affix a conventional cryo-shield over the cryo-port.

The shield portion 202 is an aluminum disk having a diameter that is slightly smaller than the central aperture diameter, e.g., approximately 5.25 inches (13.34 cm), and has a thickness of approximately 0.06 inches (0.15 cm). To define a first effective throughput area of the restrictor shield, the shield portion contains a plurality of apertures 208 (e.g., six 0.906 inch (2.30 cm) diameter circular apertures positioned at 60 degree intervals along a three inch diameter circle). The apertures are uniformly spaced apart and lie in a circular pattern about the center of the shield portion. This pattern of apertures should be considered as merely illustrative, the particular pattern will be defined by the nature of the processing to be accomplished and the desired flow pattern through the restrictor. Also, the particular diameter of the apertures that define the first effective throughput area of the restrictor shield are defined by the particular process to be accomplished.

The shield portion 202 is affixed to the mounting ring 200 via the actuator 204. The actuator is a bimetal strip fabricated from two materials having differing thermal coefficients of expansion. The two materials are formed into separate strips, then bonded to one another to form the actuator 204. The strip, when exposed to certain temperatures, will deform (bend) about its short axis 208. By judiciously selecting the materials for the member 202, the deformation of the strip is a well-defined proportional function of temperature. Also, to ensure that the shield portion moves into the conduit connecting the chamber to the pump, the material with the lesser coefficient of expansion should face the pump.

The materials should satisfy the following criteria:
(a) both materials should be process transparent or compatible;
(b) the strip must flex sufficiently in response to the temperature range defined by bakeout and processing;
(c) the strip should revert to its original shape after bakeout is complete; and
(d) the materials must be readily available and cost effective.

Bimetal strips that fulfill this criteria are commercially available from Texas Instruments—Thermostat Metals Division of Austin, Tex. One example is the bimetal strip available as "B1-Truflex". This strip is fabricated of a combination of stainless steel (a high expansion alloy) and Invar (a low expansion alloy). A typical dimension of the actuator using this type of strip to support a 5.25 (13.34 cm) inch shield portion is approximately 1.25 inches (3.17 cm) long, half inch (1.27 cm) wide, and 0.045 inches thick. Another bimetal example available from Texas Instruments is "P675-Truflex", made of a combination of Invar and a high molybdenum alloy. The following discussion assumes the actuator is fabricated of B1-Truflex having the dimensions stated above.

The actuator 204 is affixed at a first end 210 to the shield portion 202 using a fastener 214 such as a rivet, screw and nut combination, spot weld and the like. A second end 212 of the member is similarly affixed to the mounting ring 200. To facilitate non-binding motion of the shield portion relative to the mounting ring, a rectangular notch (approximately 0.600 inches (1.52 cm) wide) is cut into the edge of the shield portion and mounting ring proximate the attachment location of the actuator.

Figure 3:
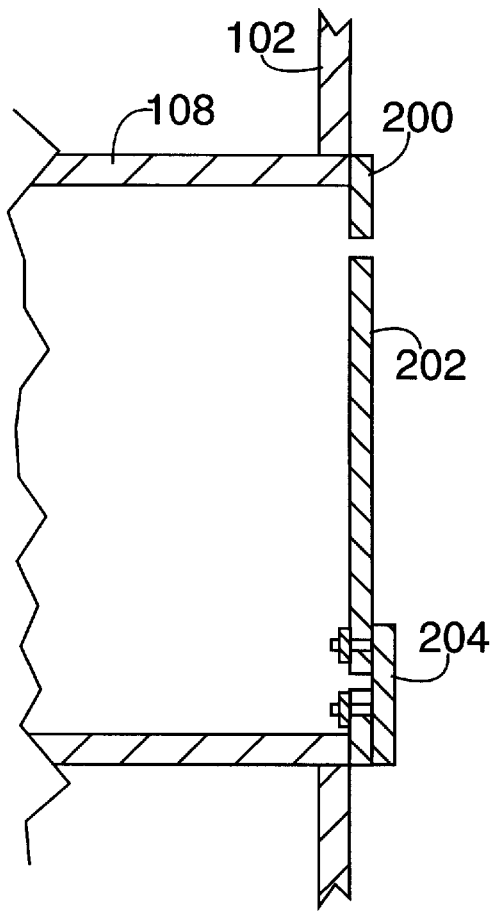
FIG. 3 depicts a vertical, cross-sectional view of the restrictor shield of FIG. 2 in a closed position.
Figure 4:
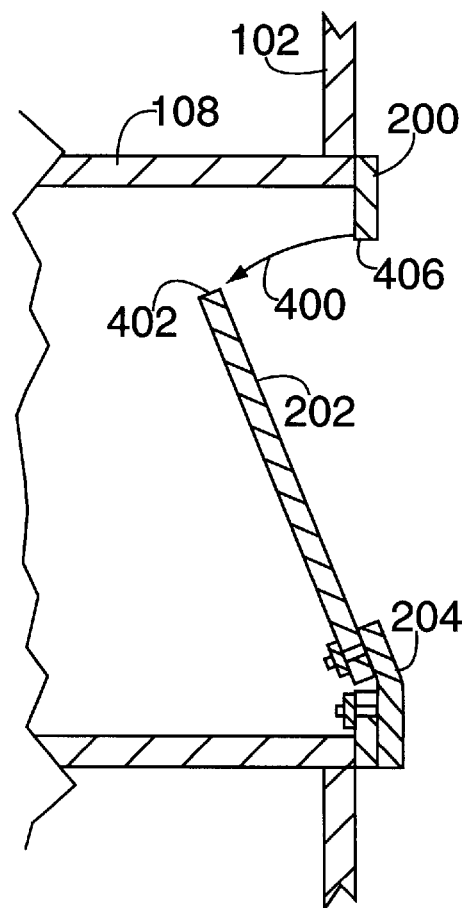
FIG. 4 depicts a vertical, cross-sectional view of the restrictor shield of FIG. 2 in an open position.

FIG. 3 depicts a vertical, cross-sectional view (along line 3—3 of FIG. 2) of the restrictor shield 112 in the closed position (producing the first effective throughput area) within the process chamber 102 and FIG. 4 depicts a vertical, cross-sectional view of the restrictor shield in the open position (producing the second effective throughput area). To best understand the function of the invention, the reader should refer to both FIGS. 3 and 4 simultaneously.

When the process chamber 102 is at a relatively low temperature, e.g., during wafer processing, pre-bakeout, or during cooldown, the restrictor shield 112 is in the closed position. The temperature of the restrictor shield, to remain closed while using B1-Truflex bimetal as the actuator 204, is less than 50 degrees Celsius. At these temperatures, the shield portion 202 is aligned with the mounting ring 200 and the restrictor shield essentially covers the cryo-port. As such, the effective throughput area (first effective throughput area) through which particles approach the cryo-pump is substantially defined by the apertures in the shield portion 202.

When the process chamber is at a relatively high temperature, e.g., during bakeout when the heating lamps are illuminating the interior of the process chamber, the restrictor shield moves into the open position. The temperature of the restrictor shield during bakeout can attain 190 degrees Celsius, but is typically about 125 degrees Celsius. When using the B1-Truflex bimetal as the actuator 204 and a temperature change of 100 degrees Celsius to achieve bakeout temperatures, the opening 400 between the inner edge 406 of the mounting ring 200 and the edge 402 of the shield portion 202 can exceed one inch. As the temperature rises to desorb and evaporate volatile particles from the chamber interior, the bimetal deforms, by an amount that is proportional to the chamber temperature, forming a cantilever that displaces the shield portion from the closed position to the open position. As such, during bakeout, the effective throughput area of the restrictor shield is substantially increased. Consequently, the throughput of particles to the cryo-pump is increased while the shield is in the open position and the process chamber is rapidly pumped to sufficient vacuum for processing.

After bakeout, the lamps are turned off, and the chamber is cooled to its pre-bakeout temperature before wafer processing is initiated. At the pre-bakeout temperatures and at the process temperatures, the restrictor shield automatically returns to its closed position and creates the first effective throughput area.

Using the present invention in a conventional PVD system has resulted in substantially reduced bakeout periods. A PVD system using a conventional restrictor shield requires a bakeout/cooldown period of between 60 and 80 hours to attain qualified status, while the same PVD system using the present invention requires a bakeout/cooldown period of between 30 and 35 hours to attain qualified status.

Figure 5:
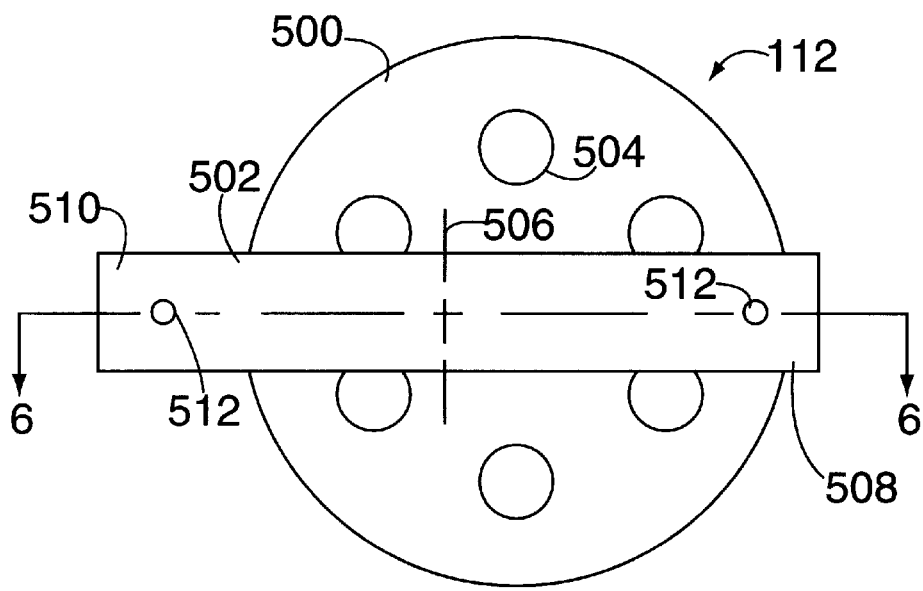
FIG. 5 depicts a front, plan view of a second embodiment of the restrictor shield of the present invention.

FIG. 5 depicts a second embodiment of the present invention. The shield portion 500 is an aluminum disk having a diameter that is slightly larger than the cryo-port diameter, e.g., approximately six inches (15.25 cm), and has a thickness of approximately 0.06 inches (0.15 cm). To define a first effective throughput area of the restrictor shield, the shield portion contains a plurality of apertures 504 (e.g., six circular apertures). The apertures are uniformly spaced apart at 60 degree intervals and lie in a circular pattern about the center of the shield portion. This pattern of apertures should be considered as merely illustrative, the particular pattern will be defined by the nature of the processing to be accomplished and the desired flow pattern through the restrictor. Also, the particular diameter of the apertures that define the first effective throughput area of the restrictor shield are defined by the particular process to be accomplished.

The shield portion 500 is affixed directly to the chamber wall via the actuator 502. The actuator is a bimetal strip fabricated from two materials having differing thermal coefficients of expansion. A typical dimension of the actuator using B1-Truflex strip to support a six inch shield portion is approximately seven inches (17.78 cm) long, one inch wide (2.54 cm), and 0.045 inches (0.11 cm) thick.

The actuator 502 is affixed at a first end 508 to the shield portion 500 using a fastener 512 such as a rivet, screw and nut combination, spot weld and the like. A second end 510 of the member is similarly affixed to the chamber wall proximate the cryo-port.

Figure 6:
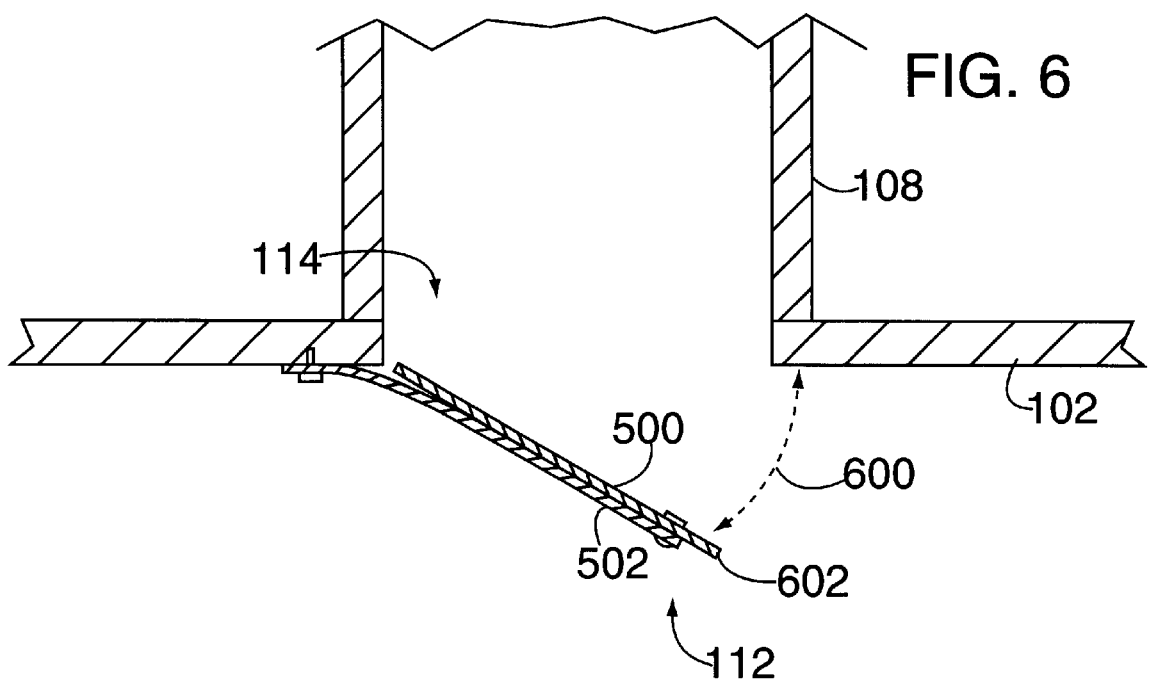
FIG. 6 depicts a vertical, cross-sectional view of the restrictor shield of FIG. 5 in an open position.

FIG. 6 depicts a vertical, cross-sectional view (along line 6—6 of FIG. 5) of the restrictor shield 112 in the open position (producing the second effective throughput area). When the process chamber is at a relatively high temperature, e.g., during bakeout when the heating lamps are illuminating the interior of the process chamber, the restrictor shield moves to the open position. When using the B1-Truflex bimetal as the actuator 502 and a temperature change of 100 degrees Celsius to achieve bakeout temperatures, the opening 600 between the chamber wall and the edge 602 of the shield portion 500 can exceed one inch (2.54 cm). As the temperature rises to desorb and evaporate volatile particles from the chamber interior, the bimetal deforms forming a cantilever that displaces the shield portion from the closed position to the open position (as shown by the arrow). As such, during bakeout, the effective throughput area of the restrictor shield is substantially increased. Consequently, the throughput of particles to the cryo-pump is increased while the shield is in the open position and the process chamber is rapidly pumped to sufficient vacuum for substrate processing.

After bakeout, the lamps are turned off, and the chamber is cooled to its pre-bakeout temperature before wafer processing is initiated. At the pre-bakeout temperatures and at the process temperatures, the restrictor shield automatically returns to its closed position and creates the first effective throughput area. At these lower temperatures, the shield portion 500 abuts the chamber wall and the restrictor shield essentially covers the cryo-port. As such, the effective throughput area (first effective throughput area) through which particles approach the cryo-pump is substantially defined by the apertures in the shield portion 500.

Figure 7:
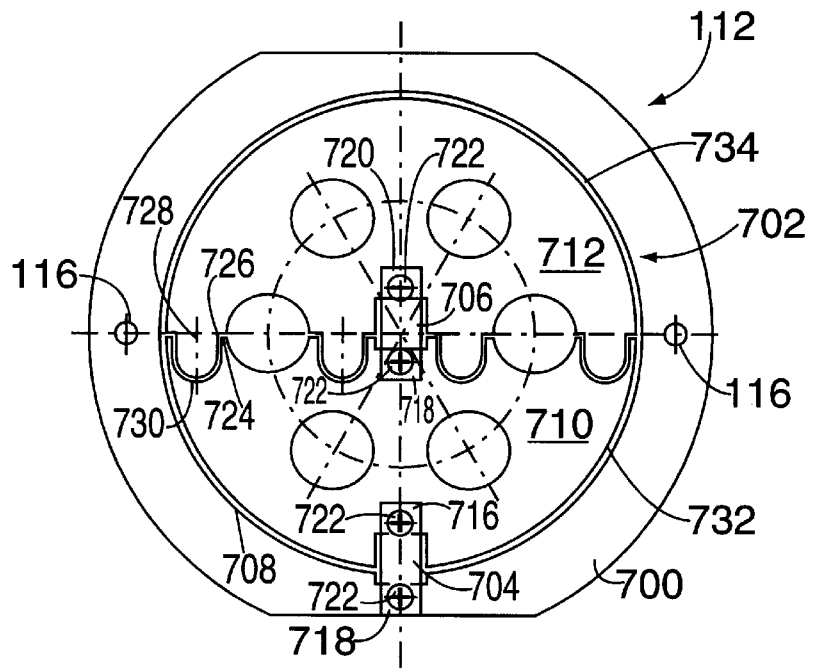
FIG. 7 depicts a front, plan view of a third embodiment of the restrictor shield of the present invention.

FIG. 7 depicts a front, plan view of the third embodiment of the restrictor shield 112 of the present invention. The restrictor shield contains a mounting ring 700, a shield portion 702, first actuator 704 and a second actuator 706. The mounting ring 700 is the same as the mounting ring 200 described with reference to FIGS. 2, 3, and 4 above.

The shield portion 702 is an aluminum disk having a diameter that is slightly smaller than the central aperture diameter, e.g., approximately 5.25 inches (13.34 cm), and has a thickness of approximately 0.06 inches (0.15 cm). To define a first effective throughput area of the restrictor shield, the shield portion contains a plurality of apertures 204 (e.g., six 0.906 inch (2.30 cm) diameter circular apertures positioned at 60 degree intervals along a three inch diameter circle). The apertures are uniformly spaced apart and lie in a circular pattern about the center of the shield portion. In this third embodiment, the shield member contains a lower portion 710 (first portion) and an upper portion 712 (second portion), where each portion has a half moon shape having a straight edge 724, 726 and an arcuate edge 732, 734.

The lower shield portion 710 is affixed to the mounting ring 700 via the first actuator 704. The upper shield portion 712 is attached to the lower shield portion via the second actuator 706. Each of the actuators is a bimetal strip. A typical dimension of each actuator using the B1-Truflex type of strip to support a 5.25 inch (13.34 cm) diameter shield portion is approximately 1.25 inches (3.17 cm) long, half inch wide (1.27 cm), and 0.045 inches (0.11 cm) thick.

The actuator 704 is affixed at a first end 716 to the lower shield portion 710 at the apex of the arcuate edge 732 using a fastener 722 such as a rivet, screw and nut combination, spot weld and the like. A second end 718 of the member is similarly affixed to the mounting ring 700. To facilitate non-binding motion of the shield portion relative to the mounting ring and between the upper and lower shield portions, a rectangular notch (approximately 0.600 inches (1.52 cm) wide) is cut into the edge of the shield portion and mounting ring proximate the attachment location of the first actuator and into the straight edges of both shield portions proximate the attachment location of the second actuator.

The second actuator has a first end 718 attached to the lower shield portion 710 and a second end 720 attached to the upper shield portion 712. The attachment occurs at a point midway along the straight edges 724, 726 of the shield potions and is accomplished using fasteners 722.

To further increase the second throughput area when the restrictor shield is in the open position, the straight edges 724 and 726 are scalloped (i.e., have a tongue-in-groove arrangement) such that the upper shield portion has a plurality of tongues 728 that extend into grooves 730 in the lower shield portion and vice versa. In the closed position, the tongue and groove portions interlock such that the upper and lower shield portions substantially form a unitary shield portion. Conversely, in the open position, the tongue portions move out of the groove portions to "open" the grooves to form additional apertures.

Figure 8:
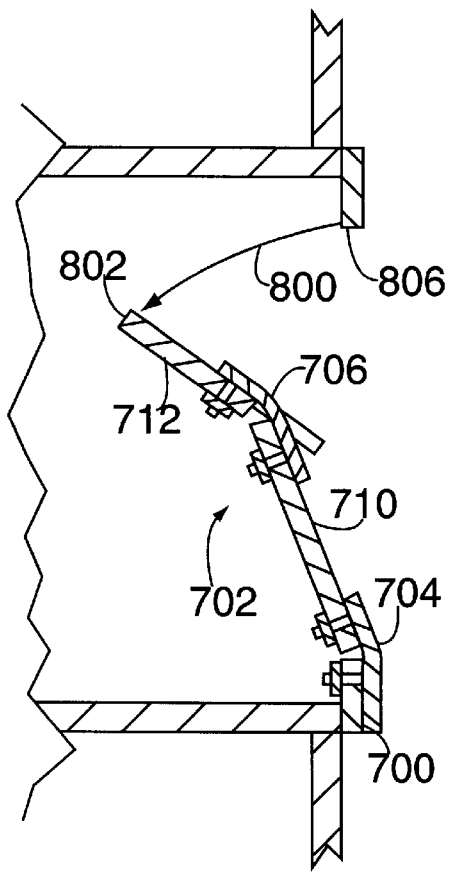
FIG. 8 depicts a vertical, cross-sectional view of the restrictor shield of FIG. 7 in an open position.

FIG. 8 depicts a vertical, cross-sectional view (along line 8—8 of FIG. 7) of the restrictor shield 112 in the open position (producing the second effective throughput area) within the process chamber 102. When the process chamber is at a relatively high temperature, e.g., during bakeout when the heating lamps are illuminating the interior of the process chamber, the restrictor shield is in the open position. When using the B1-Truflex bimetal as the actuators 704 and 706, an opening 800 forms between the inner edge 806 of the mounting ring 700 and the edge 802 of the shield portion 702. As the temperature rises to desorb and evaporate volatile particles from the chamber interior, the bimetal deforms forming a cantilever that displaces the shield portions from the closed position to the open position.

After bakeout, the lamps are turned off, and the chamber is cooled to its pre-bakeout temperature before wafer processing is initiated. At the pre-bakeout temperatures and at the process temperatures, the restrictor shield automatically returns to its closed position and creates the first effective throughput area.

There has thus been shown and described a novel restrictor shield having a variable effective throughput area. Many changes, modifications, variations and other uses and applications of the subject invention will, however, become apparent to those skilled in the art after considering this specification and the accompanying drawings which disclose the embodiments thereof. All such changes, modifications, variations and other uses and applications which do not depart from the spirit and scope of the invention are deemed to be covered by the invention, which is to be limited only by the claims which follow.

What is claimed is:

1. Apparatus for shielding a pump, comprising:
   a shield portion for shielding an inlet port to said pump, wherein said inlet port is in communication with a chamber of a semiconductor wafer processing system; and
   an actuator affixed to said shield portion and said chamber for moving said shield portion between a first position when said chamber is at a relatively low temperature and a second position when said chamber is at a relatively high temperature, wherein said first position is a substantially closed position and said second position is a substantially open position.

2. The apparatus of claim 1 wherein said first position for said shield portion defines a first effective throughput area through which particles pass to said pump and wherein said second position for said shield portion defines a second effective throughput area through which particles pass to said pump.

3. The apparatus of claim 2 wherein said first effective throughput area is defined by a plurality of apertures in said shield portion.

4. The apparatus of claim 3 wherein said first effective throughput area is defined by said plurality of apertures in said shield portion and further by an opening between said chamber and said shield portion.

5. The apparatus of claim 1 wherein said actuator moves said shield member from a first position to a second position in response to the temperature within the process chamber.

6. The apparatus of claim 1 wherein said actuator is a bimetal strip.

7. The apparatus of claim 1 further comprising:
   a mounting ring, attached to said process chamber, where said actuator is affixed to said shield potion and said mounting ring.

8. Apparatus for shielding a pump, comprising:
   a mounting ring attached to said process chamber;
   a shield portion for shielding an inlet port to said pump, wherein said inlet port is in communication with a chamber of a semiconductor wafer processing system; and
   an actuator affixed to said shield portion and said chamber for moving said shield portion between a first position when said chamber is at a relatively low temperature and a second position when said chamber is at a relatively high temperature, wherein said first position is a substantially closed position and said second position is a substantially open position.

9. The apparatus of claim 8 wherein said first position for said shield portion defines a first effective throughput area through which particles pass to said pump and wherein said second position for said shield portion defines a second effective throughput area through which particles pass to said pump.

10. The apparatus of claim 9 wherein said first effective throughput area is defined by a plurality of apertures in said shield portion.

11. The apparatus of claim 10 wherein said first effective throughput area is defined by said plurality of apertures in said shield portion and further by an opening between said chamber and said shield portion.

12. The apparatus of claim 8 wherein said actuator moves said shield member from a first position to a second position in response to the temperature within the process chamber.

13. The apparatus of claim 8 wherein said actuator is a bimetal strip.

14. The apparatus of claim 8 wherein said shield portion further comprises a first portion and a second portion, where said first portion is attached to said second portion by a second actuator.

15. The apparatus of claim 14 wherein said first portion and second portion are half moon shaped having a straight edge and an arcuate edge.

16. The apparatus of claim 15 wherein said straight edge of said first and second portions further comprise a tongue-in-groove edge pattern.

17. A method for shielding a pump, comprising the steps of:
   providing a shield for shielding an inlet port to said pump, said inlet port being in communication with a chamber of a semiconductor wafer processing system; and
   moving said shield between a first position when said chamber is at a relatively low temperature and a second position when said chamber is at a relatively high temperature wherein said first position for said shield portion defines a first effective throughput area through which particles pass to said pump and wherein said second position for said shield defines a second effective throughput area through which particles pass to said pump, said first effective area being less than said second effective area.

18. The method of claim 17 wherein said moving step further comprises the step of moving said shield from a first position to a second position in response to the temperature within the process chamber.

19. The method of claim 18 further comprises the steps of:
   supporting said shield proximate said inlet port using a bimetal actuator;
   deforming said bimetal actuator, in response to the temperature within the process chamber, to move said shield from said first position to said second position.

20. Apparatus for shielding a pump from a chamber of a semiconductor wafer processing system, comprising:
   a pump;
   a shield portion for shielding an inlet port to said pump; and
   an actuator affixed to said shield portion and said chamber for moving said shield portion between a first position when said chamber is at a relatively low temperature and a second position, when said chamber is at a relatively high temperature wherein said first position is a substantially closed position and said second position is a substantially open position.

* * * * *